(12) United States Patent
Bruijstens et al.

(10) Patent No.: US 8,730,447 B2
(45) Date of Patent: May 20, 2014

(54) LITHOGRAPHIC APPARATUS AND METHOD OF OPERATING THE APPARATUS WITH A HUMID GAS SPACE BETWEEN A PROJECTION SYSTEM AND A LIQUID CONFINEMENT STRUCTURE

(75) Inventors: Jeroen Peter Johannes Bruijstens, Eindhoven (NL); Richard Joseph Bruls, Eindhoven (NL); Hans Jansen, Eindhoven (NL); Siebe Landheer, Eindhoven (NL); Arnout Johannes Meester, Eindhoven (NL); Bauke Jansen, Deurne (NL); Ivo Adam Johannes Thomas, Son (NL); Marcio Alexandre Cano Miranda, Eindhoven (NL); Gheorghe Tanasa, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 797 days.

(21) Appl. No.: 12/559,813

(22) Filed: Sep. 15, 2009

(65) Prior Publication Data

US 2010/0066988 A1 Mar. 18, 2010

Related U.S. Application Data

(60) Provisional application No. 61/097,743, filed on Sep. 17, 2008, provisional application No. 61/150,106, filed on Feb. 5, 2009, provisional application No. 61/174,826, filed on May 1, 2009.

(51) Int. Cl.
*G03B 27/52* (2006.01)

(52) U.S. Cl.
USPC ............................................. 355/30

(58) Field of Classification Search
USPC ................................................. 355/30, 53
See application file for complete search history.

(56) References Cited

U.S. PATENT DOCUMENTS

| 4,509,852 | A  | 4/1985  | Tabarelli et al. |
| 6,954,256 | B2 | 10/2005 | Flagello et al. |
| 7,321,415 | B2 | 1/2008  | Hazelton et al. |
| 7,405,805 | B2 | 7/2008  | Uitterdijk et al. |
| 7,411,653 | B2 | 8/2008  | Hoogendam et al. |

(Continued)

FOREIGN PATENT DOCUMENTS

| EP | 1 420 300 A2 | 5/2004 |
| EP | 1 610 361 | 12/2005 |

(Continued)

OTHER PUBLICATIONS

Korean Office Action dated Nov. 30, 2011 in corresponding Korean Patent Application No. 10-2009-0087463.

(Continued)

*Primary Examiner* — Chia-how Michael Liu
(74) *Attorney, Agent, or Firm* — Pillsbury Winthrop Shaw Pittman LLP (57) ABSTRACT

A lithographic apparatus comprising a projection system, and a liquid confinement structure configured to at least partly confine immersion liquid to an immersion space defined by the projection system, the liquid confinement structure and a substrate and/or substrate table is disclosed wherein a humid gas space is defined between the projection system, the liquid confinement structure and immersion liquid in the immersion space, the humid gas space being configured to contain humid gas.

16 Claims, 6 Drawing Sheets

(56) References Cited

U.S. PATENT DOCUMENTS

| | | | |
|---|---|---|---|
| 7,684,008 | B2 | 3/2010 | De Smit et al. |
| 2004/0136494 | A1 | 7/2004 | Lof et al. |
| 2004/0207824 | A1 | 10/2004 | Lof et al. |
| 2005/0024609 | A1 | 2/2005 | De Smit et al. |
| 2005/0094119 | A1 | 5/2005 | Loopstra et al. |
| 2005/0128445 | A1 | 6/2005 | Hoogendam et al. |
| 2005/0263068 | A1* | 12/2005 | Hoogendam et al. ......... 118/668 |
| 2005/0280789 | A1 | 12/2005 | Bruls et al. |
| 2006/0017894 | A1 | 1/2006 | Van Empel et al. |
| 2006/0038968 | A1 | 2/2006 | Kemper et al. |
| 2006/0119809 | A1 | 6/2006 | Verhagen et al. |
| 2006/0139589 | A1 | 6/2006 | Uitterdijk et al. |
| 2006/0158627 | A1 | 7/2006 | Kemper et al. |
| 2007/0081140 | A1 | 4/2007 | Beckers et al. |
| 2007/0201012 | A1 | 8/2007 | Loopstra et al. |
| 2008/0106718 | A1 | 5/2008 | Okada et al. |
| 2009/0059192 | A1 | 3/2009 | Beckers et al. |
| 2009/0103070 | A1 | 4/2009 | Shirai et al. |
| 2010/0066987 | A1 | 3/2010 | Bruijstens et al. |
| 2010/0296067 | A1 | 11/2010 | Thomas et al. |

FOREIGN PATENT DOCUMENTS

| | | |
|---|---|---|
| EP | 1 736 831 | 12/2006 |
| JP | 2004-095654 | 3/2004 |
| JP | 2004-259966 | 9/2004 |
| JP | 2005-093997 | 4/2005 |
| JP | 2005-136413 | 5/2005 |
| JP | 2006-128192 | 5/2006 |
| JP | 2006-165285 | 6/2006 |
| JP | 2006-165500 | 6/2006 |
| JP | 2006-191066 | 7/2006 |
| JP | 2007-059556 | 3/2007 |
| JP | 2007-110109 | 4/2007 |
| JP | 2007-528115 | 10/2007 |
| JP | 2008-010892 | 1/2008 |
| JP | 2008-199069 | 8/2008 |
| JP | 2009-038373 | 2/2009 |
| JP | 2009-536452 | 10/2009 |
| JP | 2010-074160 | 2/2010 |
| KR | 2005-0110033 | 11/2005 |
| KR | 2006-0133917 | 12/2006 |
| TW | 200525290 A | 8/2005 |
| WO | WO 99/49504 A1 | 9/1999 |
| WO | WO 2005/064405 A2 | 7/2005 |
| WO | 2007/128835 | 11/2007 |

OTHER PUBLICATIONS

Japanese Office Action dated Oct. 26, 2011 in corresponding Japanese Patent Application No. 2009-208753.

Japanese Office Action dated Oct. 26, 2011 in corresponding Japanese Patent Application No. 2009-208754.

Japanese Office Action mailed Mar. 13, 2012 in corresponding Japanese Patent Application No. 2009-208754.

U.S. Office Action mailed Jul. 9, 2012 in corresponding U.S. Appl. No. 12/559,664.

U.S. Office Action mailed Nov. 8, 2012 in corresponding U.S. Appl. No. 12/559,664.

U.S. Office Action dated Jun. 7, 2013 in corresponding U.S. Appl. No. 12/770,356.

* cited by examiner

LITHOGRAPHIC APPARATUS AND METHOD OF OPERATING THE APPARATUS WITH A HUMID GAS SPACE BETWEEN A PROJECTION SYSTEM AND A LIQUID CONFINEMENT STRUCTURE

This application claims priority and benefit under 35 U.S.C. §119(e) to U.S. Provisional Patent Application No. 61/097,743, entitled "Lithographic Apparatus and a Method of Operating the Apparatus", filed on Sep. 17, 2008, to U.S. Provisional Patent Application No. 61/150,106, entitled "Lithographic Apparatus and a Method of Operating the Apparatus", filed on Feb. 5, 2009, and to U.S. Provisional Patent Application No. 61/174,826, entitled "Lithographic Apparatus and a Method of Operating the Apparatus", filed on May 1, 2009. The content of each of the foregoing applications is incorporated herein in its entirety by reference.

FIELD

The present invention relates to an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

Figure 2:
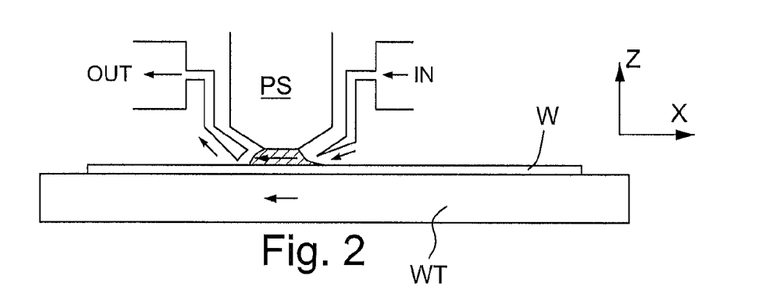
FIGS. 2 and 3 depict a fluid handling structure as a liquid supply system for use in a lithographic projection apparatus.
Figure 3:
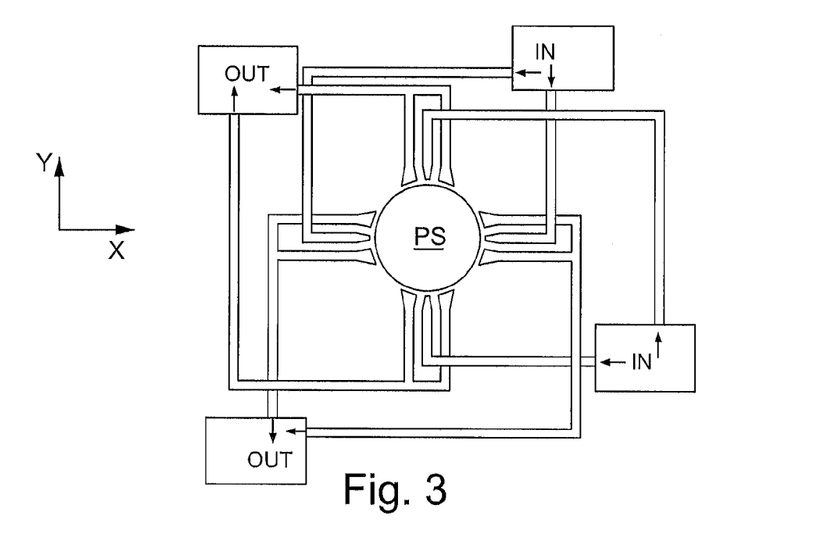

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element. Liquid is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
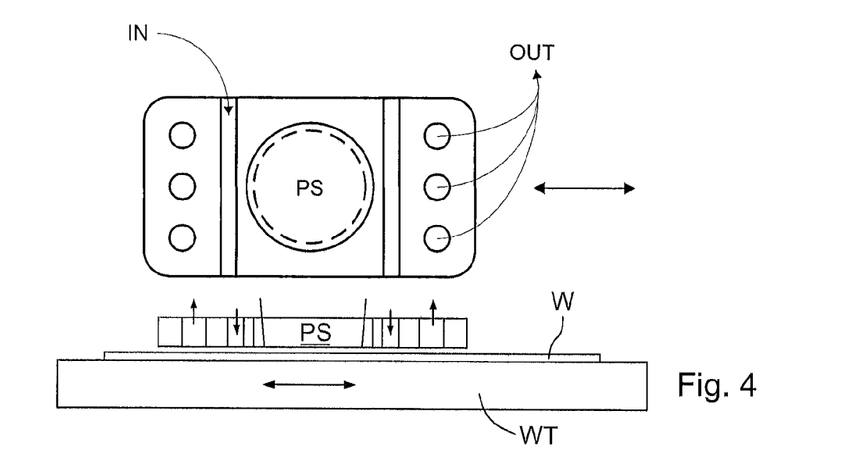
FIG. 4 depicts a further liquid supply system for use in a lithographic projection apparatus.

A further immersion lithography solution with a localized liquid supply system is shown in FIG. 4. Liquid is supplied by two groove inlets IN on either side of the projection system PS and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PS and removed by a plurality of discrete outlets OUT on the other side of the projection system PS, causing a flow of a thin film of liquid between the projection system PS and the substrate W. The choice of which combination of inlet IN and outlets OUT to use can depend on the direction of movement of the substrate W (the other combination of inlet IN and outlets OUT being inactive).

Figure 5:
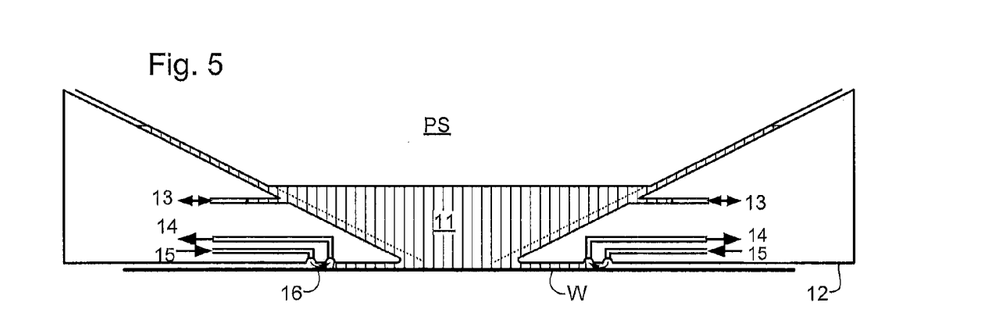
FIG. 5 depicts, in cross-section, a barrier member which may be used in an embodiment of the present invention as a liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, for example ASML's "Twinscan" lithographic apparatus, the substrate tables swap takes place under the projection system.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

The immersion system may be a fluid handling system or apparatus. In one embodiment the fluid handling system may supply immersion fluid or liquid and therefore be a fluid or liquid supply system. In an embodiment the fluid handling system may confine fluid or liquid and thereby be a fluid or liquid confinement system. In an embodiment the fluid handling system may provide a barrier to fluid or liquid and thereby be a barrier member. In an embodiment the fluid handling system may create or use a flow of gas, for example to help in handling liquid. In an embodiment immersion liquid rather than immersion fluid is used. In that case the fluid handling system may be a liquid handling system. The fluid handling system is located between the projection system and the substrate table.

In a fluid handling system or liquid confinement structure, liquid is confined to a space, for example within a confinement structure by the body of the structure, the underlying surface (e.g. a substrate table, a substrate supported on the substrate table, a shutter member and/or a measurement table) and, in the case of a localized area immersion system, a liquid meniscus between the fluid handling system or liquid confinement structure and the underlying structure i.e. in an immersion space. In the case of an all wet system, liquid is allowed to flow out of the immersion space onto the top surface of the substrate and/or substrate table.

SUMMARY

Droplets of liquid may splash onto the part of the final element of the projection system which is not normally in contact with immersion liquid in the immersion space. Such droplets can then evaporate forming cold spots on the last optical (e.g., lens) element leading to imaging errors and/or focusing errors.

It is therefore desirable to provide a system to reduce the effect of droplets on the last optical element or substantially to avoid such droplet formation.

In an aspect of an invention, there is provided a lithographic apparatus comprising a projection system, and a liquid confinement structure configured to at least partly confine immersion liquid to an immersion space defined by the projection system, the liquid confinement structure and a substrate and/or substrate table, wherein a humid gas space is defined between the projection system, the liquid confinement structure and immersion liquid in the immersion space, the humid gas space being configured to contain humid gas.

According to an embodiment of the invention, there is provided a method of reducing an evaporational load from a droplet on a final element of a projection system in an immersion lithography apparatus in which a liquid confinement structure is configured to at least partly confine immersion liquid to an immersion space defined by a projection system, the liquid confinement structure and a substrate and/or substrate table, the method comprising containing humidified gas in a humid gas space defined between the projection system, the liquid confinement structure and immersion liquid in the immersion space.

In an aspect of the invention, there is provided a lithographic apparatus comprising: a projection system; a liquid confinement structure to at least partly confine immersion liquid to an immersion space defined by the projection system, the liquid confinement structure and a substrate and/or substrate table; and a device for forcing immersion liquid in a radially outward direction and in contact with a downwardly facing surface of the final optical element of the projection system.

In an aspect of the invention, there is provided a method of reducing an evaporational load on a projection system in an immersion lithographic apparatus in which a liquid confinement structure at least partly confines immersion liquid to an immersion space defined by the projection system, the liquid confinement structure and a substrate and/or substrate table, the method comprising: forcing immersion liquid in a radially outward direction and in contact with a downwardly facing surface of the final optical element of the projection system.

According to an embodiment of the invention, there is provided a lithographic apparatus wherein an optical element insulator is located between a projection system and a liquid confinement structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
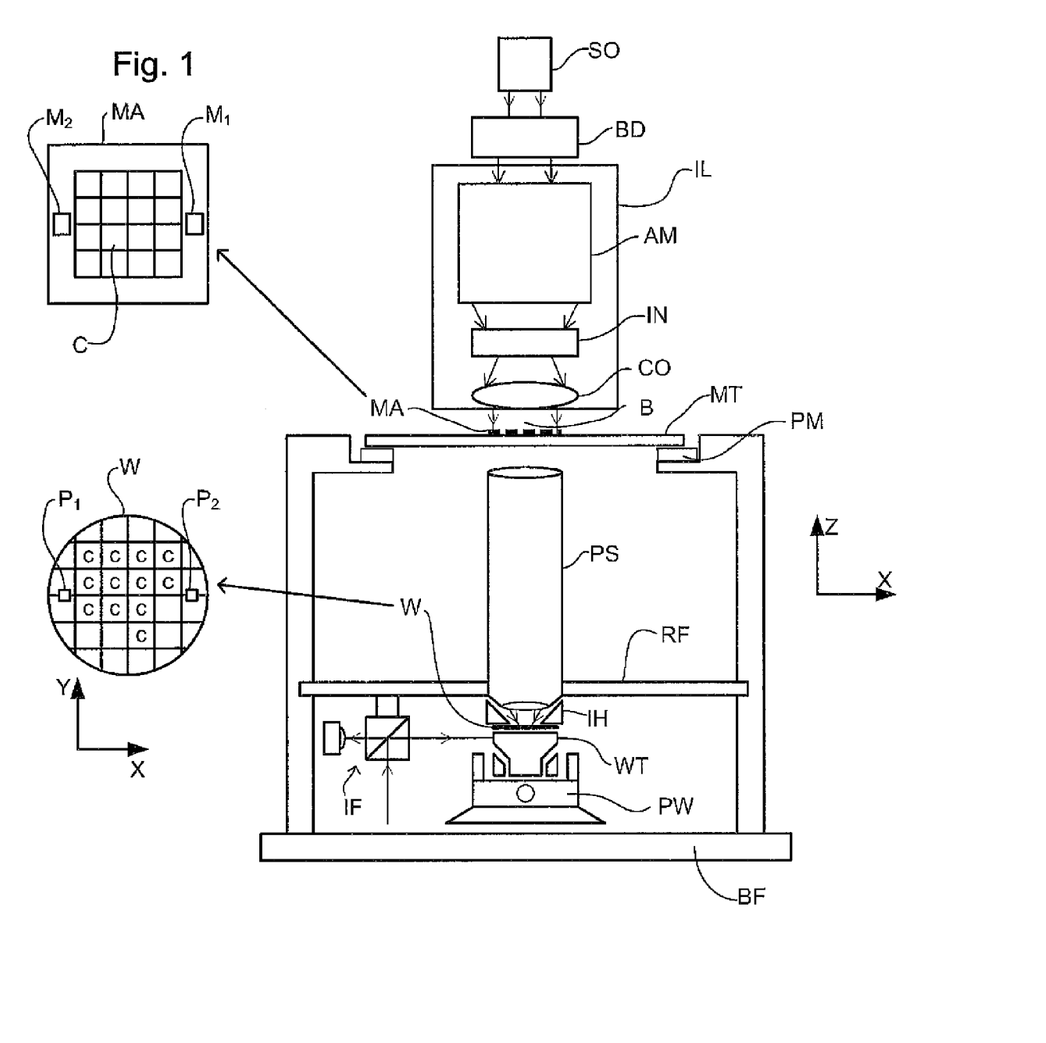
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS. The projection system focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement to provide liquid between a final element of the projection system PS and the substrate is the so called localized immersion system IH. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5. The liquid supply systems disclosed in FIGS. 2-4 were described above.

FIG. 5 schematically depicts a localized liquid supply system with a liquid confinement structure 12. The liquid confinement structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure and the surface of the substrate W and may be a contactless seal such as fluid seal, desirably a gas seal.

The liquid confinement structure 12 at least partly contains liquid in the immersion space 11 between a final element of the projection system PS and the substrate W. A contactless seal 16 to the substrate W may be formed around the image field of the projection system so that liquid is confined within the space between the substrate W surface and the final element of the projection system PS. The immersion space is at least partly formed by the liquid confinement structure 12 positioned below and surrounding the final element of the projection system PS. Liquid is brought into the space below the projection system and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the immersion space 11 by a gas seal 16 which, during use, is formed between the bottom of the barrier member 12 and the surface of the substrate W. Other types of seal are possible, as is no seal (for example in an all wet embodiment). The gas seal is formed by gas, e.g. air or synthetic air but, in an embodiment, $N_2$ or another inert gas. The gas in the gas seal is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the liquid confinement structure 12 and the substrate W contains the liquid in an immersion space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

Other arrangements are possible and, as will be clear from the description below, an embodiment of the present invention may use any type of localized liquid supply system as the liquid supply system.

One or more localized liquid supply systems seal between a part of the liquid supply system and a substrate W. The seal may be defined by a meniscus of liquid between the part of the liquid supply system and the substrate W. Relative movement of that part of the liquid supply system and the substrate W may lead to breakdown of the seal, for example the meniscus, and thereby leaking of liquid. The problem may be more significant at high scan velocities. An increased scan velocity is desirable because throughput increases.

Figure 6:
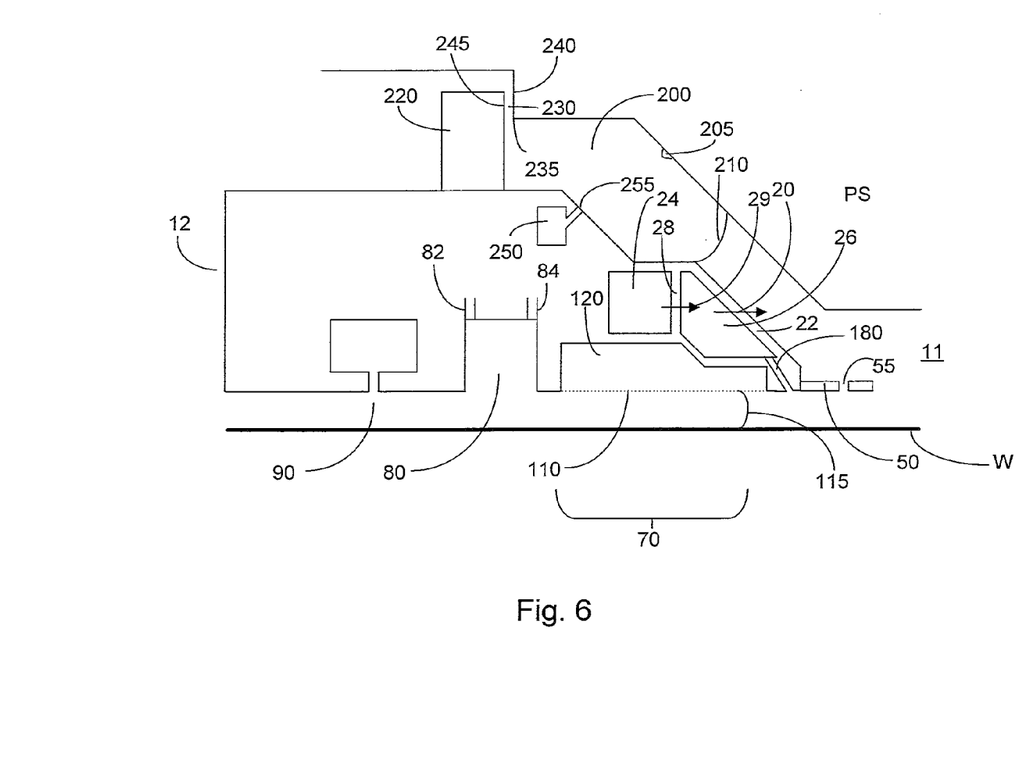
FIG. 6 depicts, in cross-section, a liquid confinement structure and projection system according to an embodiment of the invention.

FIG. 6 illustrates a liquid confinement structure 12 which is part of a liquid supply system. The liquid confinement structure 12 extends around the periphery (e.g., circumference) of the final element of the projection system PS in a plane parallel to the top surface of the substrate table and/or perpendicular to the optical axis such that the liquid confinement structure (which is sometimes called a barrier member or seal member) is, for example, substantially annular in overall shape. That is, the barrier member encloses the last optical (e.g., lens) element. The barrier member may be an annulus and may be ring-shaped. The projection system PS may not be circular and the outer edge of the liquid confinement structure 12 may also not be circular so that it is not necessary for the barrier member to be ring shaped. The liquid confinement structure could also be other shapes so long as it has an opening through which the projection beam may pass out from the final element of the projection system PS. The opening may be centrally located. Thus, during exposure, the projection beam may pass through liquid contained in the opening of the liquid confinement structure and onto the substrate W. The liquid confinement structure 12 may be, for example, substantially rectangular and may not be necessarily the same shape as the final element of the projection system PS is at the height of the liquid confinement structure 12.

The function of the liquid confinement structure 12 is at least partly to maintain or confine liquid in the space between the projection system PS and the substrate W so that the projection beam may pass through the liquid. That space is known as the immersion space. The top level of liquid is simply contained by the presence of the liquid confinement structure 12. The level of liquid in the space is maintained such that the liquid does not overflow over the top of the liquid confinement structure 12.

The immersion liquid is provided to the space 11 by the liquid confinement structure 12 (thus the barrier member may be considered to be a fluid handling structure). A passageway or flow path for immersion liquid passes through the liquid confinement structure 12. Part of the flow path is comprised by a chamber 26. The chamber 26 has two side walls 28, 22. Liquid passes from chamber 24 through the first side wall 28 into chamber 26 and then through the second side wall 22 into the space 11. A plurality of outlets 20 provide the liquid to the space 11. The liquid passes through holes 29, 20 in side walls 28, 22 respectively prior to entering the space 11. The location of the through holes 20, 29 may be irregular.

A seal is provided between the bottom of the liquid confinement structure 12 and the substrate W (This feature indicates that the barrier member may be a fluid handling structure). In FIG. 6 a seal device is configured to provide a contactless seal and is made up of several components. Radially outwardly from the optical axis of the projection system PS, there is provided a (optional) flow plate 50 which extends into the space (though not into the path of the projection beam) which helps maintain substantially parallel flow of the immersion liquid out of outlet 20 across the space. The flow control plate has through holes 55 in it to reduce the resistance to movement in the direction of the optical axis of the barrier member 12 relative to the projection system PS and/or substrate W.

Radially outwardly of the flow control plate 50 on the bottom surface of the liquid confinement structure 12 may be an inlet 180. The inlet 180 can provide liquid in a direction towards the substrate. During imaging this may be useful in preventing bubble formation in the immersion liquid by filling a gap between the substrate W and substrate table WT with liquid.

Radially outwardly of the inlet 180 may be an extractor assembly 70 to extract liquid from between the liquid confinement structure 12 and the substrate W and/or the substrate table WT. The extractor 70 will be described in more detail below and forms part of the contactless seal which is created between the liquid confinement structure 12 and the substrate W. The extractor may operate as a single phase or as a dual phase extractor.

Radially outwardly of the extractor assembly 70 may be a recess 80. The recess is connected through an inlet 82 to the atmosphere. The recess is connected via an outlet 84 to a low pressure source. The inlet 82 may radially outwardly positioned with respect to the outlet 84. Radially outwardly of the recess 80 may be a gas knife 90. An arrangement of the extractor, recess and gas knife is disclosed in detail in United States patent application publication no. US 2006/0158627. However, in that document the arrangement of the extractor assembly is different.

The extractor assembly 70 comprises a liquid removal device or extractor or inlet such as the one disclosed in United States patent application publication no. US 2006-0038968, incorporated herein its entirety by reference. Any type of liquid extractor may be used. In an embodiment, the liquid removal device 70 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas from being drawn into the chamber 120 of the liquid removal device 70. However, when the porous surface 110 comes into contact with liquid there is no meniscus to restrict flow and the liquid can flow freely into the chamber 120 of the liquid removal device 100. The porous surface 110 extends radially inwardly along the liquid confinement structure 12 (as well as around the space). The rate of extraction through the porous surface 110 varies according to how much of the porous material 110 is covered by liquid.

The porous material 110 has a large number of small holes each with a dimension, e.g. a width, such as a diameter, $d_{hole}$ in the range of 5 to 50 μm. The porous material may be maintained at a height in the range of 50 to 300 μm above a surface from which liquid is to be removed, e.g. the surface of a substrate W. In an embodiment, porous material 110 is at least slightly liquidphilic, i.e. having a contact angle of less than 90°, desirably less than 85° or desirably less than 80°, to the immersion liquid, e.g. water.

It may not always be possible to prevent gas being drawn into the liquid removal device but the porous material 110 will prevent large uneven flows that may cause vibration. Microsieves made by electroforming, photoetching and/or laser cutting can be used as the porous material 110. Suitable sieves are made by Stork Veco B.V., of Eerbeek, the Netherlands. Other porous plates or solid blocks of porous material may also be used, provided the pore size is suitable to maintain a meniscus with the pressure differential that will be experienced in use.

During scanning of the substrate W (during which the substrate moves under the liquid confinement structure 12 and projection system PS) the meniscus 115 extending between the substrate W and the liquid confinement structure 12 may be drawn either towards or away from the optical axis by a drag force applied by the moving substrate. This can lead to liquid loss which may result in: evaporation of the liquid, cooling of the substrate, and consequent shrinkage and overlay errors as described above. Liquid stains may also or alternatively be left behind from interaction between the liquid droplets and resist photochemistry.

Although not specifically illustrated in FIG. 6, the liquid supply system has an arrangement to deal with variations in the level of the liquid. This is so that liquid which builds up between the projection system PS and the liquid confinement structure 12 can be dealt with and does not spill. Such a build-up of liquid might occur during relative movement between the barrier member 12 and the projection system PS described below. One way of dealing with this liquid is to provide the liquid confinement structure 12 so that it is very large so that there is hardly any pressure gradient over the periphery (e.g., circumference) of the liquid confinement structure 12 during relative movement between the liquid confinement structure 12 and the projection system PS. In an alternative or additional arrangement, liquid may be removed from the top of the liquid confinement structure 12 using, for example, an extractor such as a single phase extractor similar to the extractor 70. An alternative or additional feature is a liquidphobic (e.g., hydrophobic) coating. The coating may form a band around the top of the liquid confinement structure 12 surrounding the opening and/or around the last optical element of the projection system PS. The coating may be radially outward of the optical axis of the projection system. The liquidphobic (e.g., hydrophobic) coating helps keep the immersion liquid in the space.

An embodiment of the present invention will be described with reference to a liquid confinement structure 12 with the above mentioned structure. However, it will be apparent that any other type of liquid confinement structure or liquid handling system which provides liquid to an immersion space between the final element of the projection system PS and a substrate W may be applied in an embodiment of the invention. A liquid confinement structure or fluid handling system of both a localized area immersion lithographic apparatus and an all wet arrangement may be applied in an embodiment of the invention.

An embodiment of the invention is intended to help solve the problem of cold spots forming on the last optical element caused by evaporating droplets. An embodiment of the invention may prevent evaporation of a droplet 205 within a humid gas space 200, which could apply an unwanted heat load to a) the liquid confinement structure 12 (although this is not as significant a problem as for the last optical element); and/or b) the last optical element. A solution is to have a humid environment in a humid gas space 200 between the final element of the projection system PS, the liquid confinement structure 12 and the immersion space 11. The humid gas is retained by a constriction or gas flow restriction 230, which may be less than 3 mm, and desirably less than 10 micrometers in width. A practical width may be between 0.2-0.3 mm. This gas flow restriction can be viewed as a leaky seal. That is, it is not a perfect seal. The leaky seal is thus a non-contact leaky seal to maintain a humid environment in a humid gas space 200 defined by the surface of the final element and the meniscus 210 of the immersion space 11 between the liquid confinement structure 12 and the final element.

The gas flow restriction 230 is desirably positioned relative to the optical axis to maximize the benefit of the humidified volume. The humidified gas within the space is confined relative to the gas radially outward of the restriction. That is, the gas outside the restriction may be entrained in a gas flow. Therefore it may be advantageous to position the restriction as far radially outwardly as possible. This would minimize the radially outward portion of the volume between the liquid confinement structure 12 and the final element of the projection system. However, this needs to be balanced against possible loss in through-put if the humid gas space 200 is too large; it takes time to achieve equilibrium in the humid gas space 200 and the larger it is the longer it takes to achieve equilibrium which should be achieved before scanning starts. As with all embodiments, it may be desirable to ensure that at least all of the downwardly facing surface of the final optical element of the projection system is protected from high thermal loads. Therefore, as shown in FIG. 6, the gas flow restriction 230 is provided radially outwardly of the radially outward edge 235 of the final optical element of the projection system. Alternatively the flow restriction or other means of preventing evaporation or preventing the formation of droplets on the projection system PS may be provided further radially outwardly, for example as illustrated in FIG. 9. The gas flow restriction 230 or seal of all embodiments of FIGS. 6-11 may be arranged so that there is (practically) no transfer of force between the liquid confinement structure 12 and the projection system PS, and in the embodiments of FIGS. 6-10 arranged so that there is (practically) no contact between the liquid confinement structure 12 and the projection system PS. The seal/restriction separates the radially inward atmosphere from the radially outward atmosphere.

For the last optical element of the projection system PS that is in contact with immersion liquid, evaporation may cause temperature changes in the optical element, causing optical aberrations. Other solutions that may be used include one or more liquidphobic layers and/or a gas ($N_2$) overpressure to avoid evaporation. Evaporation may be avoided by placing the entire optical part that is suffering form the evaporation into a humid volume. The leaky seal that is proposed in U.S. patent application publication No. US 2006/0017894 can be used as a gas flow restriction 230 to keep humidified gas in the liquid confinement structure 12 region.

Below a certain threshold of relative humidity, immersion liquid evaporates. Evaporation of liquid, for example as a droplet, applies a heat load to the surface on which it is located. At or above the certain threshold of relative humidity evaporation is significantly reduced, if not stopped. The gas is saturated with the immersion liquid vapour. Thus the evaporation can be reduced or suppressed by ensuring that the entire area that can reduce optical performance if a cold spot is formed on it by evaporation, is surrounded by humid gas (relative humidity large enough to avoid evaporation of fluid). This volume can be enclosed by using a leaky seal between the liquid confinement structure 12 and the final element of the projection system PS. Thus, the gap between the final element and the liquid confinement structure 12 is closed to several parts of a mm (typical ~0.3 mm). If evaporation is avoided, the temperature offset is avoided and therefore the optical aberration is avoided.

Because the humid gas prevents evaporation of droplets on, for example, the projection system PS, the humid gas can be considered an insulator. That is, the presence of humid gas avoids an evaporational heat load being applied to applicable surface such as the projection system PS. The humid gas therefore has an insulating effect on the applicable surface such as the projection system PS (and in particular on the final optical element of the projection system PS (which is in contact with immersion liquid)). Therefore, the humid gas is an insulator present between the projection system PS and the liquid confinement system.

In FIG. 6 a humid gas space 200 is positioned underneath the projection system PS and above the liquid confinement structure 12. Humid gas can be contained or confined in the humid gas space 200. Radially inwardly the humid gas space is bounded by a meniscus 210 of liquid of the immersion space 11. Radially outwardly the humid gas space 200 is bounded by a part 220 of the liquid confinement structure 12. A gas flow restriction 230 is thereby created between the part 220 of the liquid confinement structure 12 and a surface 240 of the projection system PS. A vertical surface 245 of the part 220 of the liquid confinement structure 12 faces the surface 240 of the projection system and is positioned closely to that surface to define a gas flow restriction 230.

The surfaces 245, 240 which form the flow restriction may be substantially vertical surfaces. This allows, for example, movement of the liquid confinement structure 12 in the direction of the optical axis (z direction) relative to the projection system PS.

The geometry of the projection system PS and in particular the surface 240 and of the liquid confinement structure 12 and surface 245 of the liquid confinement structure is adjusted so that the size of the flow restriction 230 is less than 3 mm, desirably less than 2 mm, desirably less than 1 mm, desirably less than 0.5 mm, desirably less than 0.3 mm, desirably less than 0.2 mm or desirably less than 0.1 mm. The size of the flow restriction 230 is the distance by which the two surfaces 240, 245 of the projection system and liquid confinement structure 12 respectively are apart. The overlap between the two surfaces 240, 245 is desirably at least 1 mm, desirably at least 2 mm, or desirably at least 5 mm during normal use (i.e. during scanning). The longer the overlap, the greater the sealing capacity.

The gas flow restriction may be a contactless seal between the confinement structure 12 and the projection system PS. Thus, (practically) no force is transmitted between the liquid confinement structure and the projection system, also not with vertical movement between these two bodies. Desirably the gas flow restriction is configured substantially to hinder a gas flow through the gas restriction. Desirably the flow is restricted radially outwardly. Desirably the gas flow is restricted radially inwardly. The liquid confinement structure 12 and projection system PS are not in contact. Desirably the contactless seal prevents gas flow through the gas restriction 230. In particular gas flow radially outwardly (relative to the optical axis) through the gas restriction is substantially prevented, resulting in two more or less separated atmospheres.

In one embodiment a humid gas source 250 may be provided which supplies gas through an orifice 255 in the liquid confinement structure 12 to the humid gas space 200. Thereby humid gas can be replenished to the humid gas space 200. There may be an opening, for example in the liquid confinement structure 12, to extract gas from the humid gas space 200. The opening may also serve to remove liquid from the immersion space 11. An advantage of this is that because any gas present would be humidified, this would prevent evaporation in the fluid removal system. Also the extracted gas could be resupplied by the humid gas source 250 to the humid gas space 200. Alternatively the opening could be solely for gas extraction and one or more separate openings could be provided for removal of liquid from the immersion space 11.

As can be seen, the flow restriction 230 partitions the space between the projection system PS and the liquid confinement structure 12 into a radially inward space for the humid gas (i.e. the humid gas space 200) and a radially outward part in fluid communication with the external atmosphere radially outwardly of the liquid confinement structure 12 and projection system PS.

Figure 7:
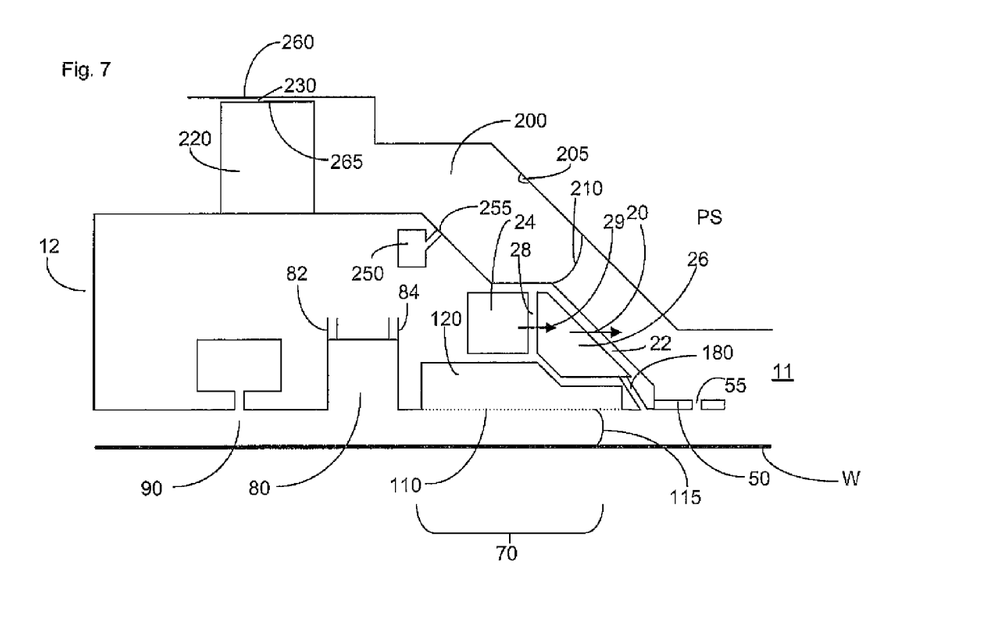
FIG. 7 depicts, in cross-section, a liquid confinement structure and projection system in accordance with a further embodiment of the invention.

FIG. 7 shows a further embodiment in which the flow restriction 230 is provided between a top surface 265 of a part 220 of the liquid confinement structure 12 and a downwardly facing surface 260 of the projection system PS. Therefore, both of the surfaces 260, 265 defining the flow restriction 230 are horizontal surfaces. In the case of the flow restriction 230 being horizontal, the gap may be 1-4 mm. This allows relative movement in directions substantially perpendicular to the optical axis of the projection system PS between the liquid confinement structure 12 and the projection system PS.

Figure 8:
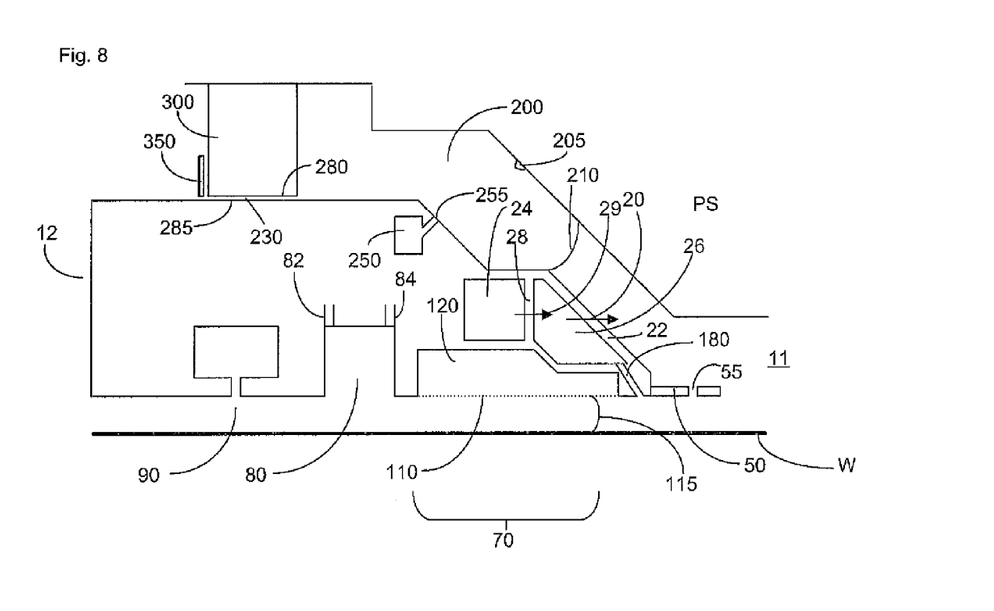
FIG. 8 depicts, in cross-section, a liquid confinement structure and projection system in accordance with a further embodiment of the invention.
Figure 9:
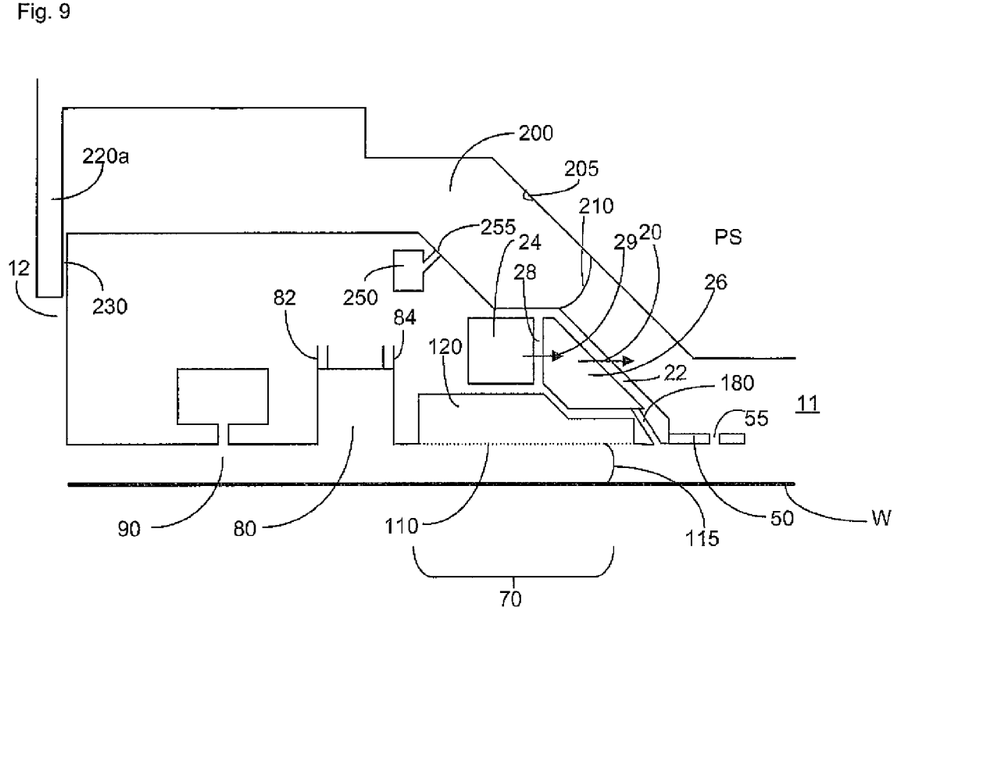
FIG. 9 depicts, in cross-section, a liquid confinement structure and projection system in accordance with a further embodiment of the invention.

In a further embodiment in FIG. 8, a projection 300 is provided on a downwardly facing surface of the projection system PS. However, the projection 300 could be on a vertical surface. The projection provides a downwardly facing surface 280 which interacts with a surface 285 of the liquid confinement structure 12 to form a gas flow restriction 230 therebetween. A different surface of the final element of the projection system could be used and it may not be necessary to have a projection 300.

The embodiment in FIG. 8 could be altered such that vertical surfaces of the projection system PS and liquid confinement structure 12 form the gas flow restriction 230 rather than or in addition to the horizontal surfaces illustrated in FIG. 8. This would have a same advantage as the embodiment of FIG. 6 of allowing relative movement in the direction of the optical axis between the projection system PS and liquid confinement structure 12.

The flow restriction 230 of the above described embodiments reduces the flow of gas out of the humid gas space 200. Thereby the atmosphere in the fluid gas space 200 can be maintained humid thereby avoiding evaporation of droplets 205 on parts of the final element of the projection system PS not normally covered in liquid. Therefore, an embodiment of the invention may be seen as an optical element insulator located between the projection system PS and the liquid confinement structure (immersion hood). The effect of an embodiment of the invention is to prevent the application of localized thermal loads to an optical element by evaporation of droplets on the surface of the final element of the projection system. As droplets cannot form or evaporate on the final element, the embodiment in effect insulates the projection system from such localized thermal loads.

United States patent application publication no. US 2006/0017894 discloses a contactless seal. Such a seal may be provided as the flow restriction 230 in an embodiment of the present invention. The gas flow restriction may be seen as providing a diffusion barrier between the ambient atmosphere gas radially outwardly of the humid gas space 200 and the humid gas inside humid gas space 200. In this respect, the diffusion barrier is formed by an elongate, narrow gas channel or flow restriction 230 which provides communication of the humid gas of the humid gas space 200 with the ambient atmosphere.

The dimensions of the gas flow restriction 230 are specifically designed to hinder or prevent escape of humid gas from the humid gas space 200. To prevent contamination of the ambient atmosphere, a gas extraction device 350 may be mounted near the outflow opening of the gas flow restriction 230 to exhaust leaks of humid gas. This can apply to any embodiment. If the pressure of the gas of the ambient atmosphere is substantially the same as the pressure of humid gas in the humid gas space 200, there will be little driving force for humid gas to leave the humid gas space 200.

FIG. 9 depicts a further embodiment of the present invention. The embodiment of FIG. 9 is the same as the embodiment illustrated in FIG. 6 except as described below.

In the embodiment of FIG. 9, instead of having part 220 formed as a projection from the liquid confinement structure 12, a projection 220a is formed on the projection system PS. The projection 220a extends downwardly towards the liquid confinement structure 12. A gas flow restriction 230 is formed between a vertical surface of the projection 220a and a vertical surface of the liquid confinement structure 12. In the case of FIG. 9, the vertical surface of the liquid confinement structure 12 which is used is the radially outward edge of the liquid confinement structure 12. However, this is not necessarily the case and a part similar part 220 may be formed on the liquid confinement structure 12 (e.g., as shown in FIG. 6) to define the gas flow restriction 230 between it and the projection 220a of the projection system PS. As explained above, the arrangement in FIG. 6 results in the humid gas space 200 extending out to the edge 235 of the final optical element of the projection system PS. An optical element is an element through which the beam PB passes, desirably an element which changes the characteristics of the beam (i.e. it is not a flat plate in a plane perpendicular to the beam PB). In the embodiment of FIG. 9, it can be seen that the humid gas space 200 extends radially outwardly further than the edge 235 of the final optical element of the projection system PS (as shown in FIG. 6). However, this need not be the case. Similarly, the arrangement of FIG. 6 can be so that the humid gas space 200 extends radially further outward than the edge 235 of the final optical element of the projection system PS.

Figure 10:
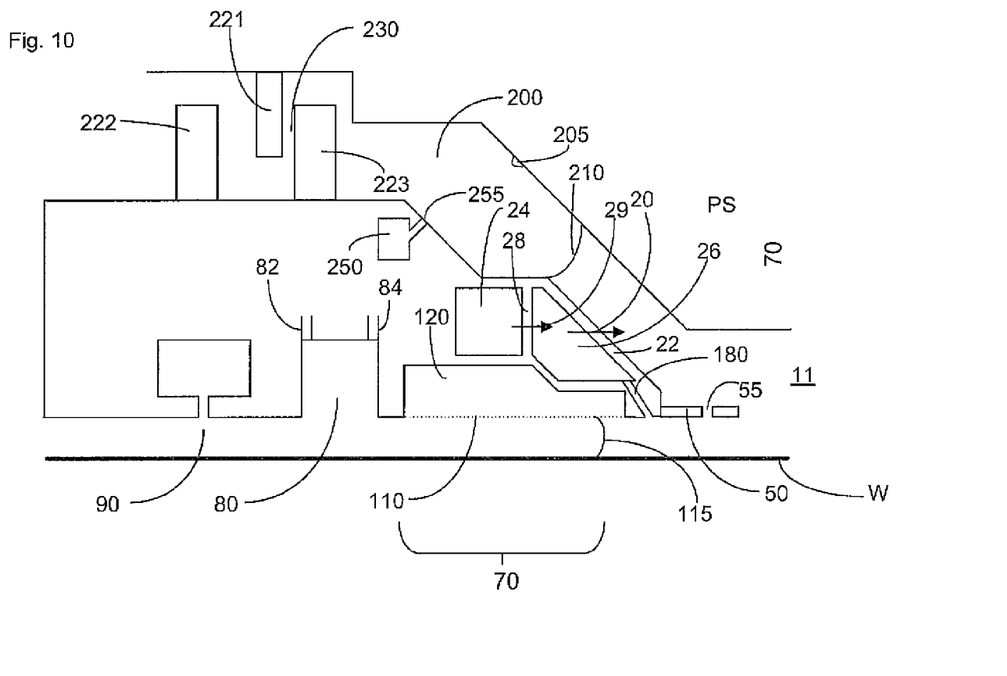
FIG. 10 depicts, in cross-section, a liquid confinement structure and projection system in accordance with a further embodiment of the invention.

A further embodiment is illustrated in FIG. 10. The embodiment of FIG. 10 is the same as the embodiment illustrated in FIG. 6 except as described below. In the embodiment of FIG. 10 a labyrinth seal or multiple seal is formed between the projection system PS and the liquid confinement structure 12. A labyrinth seal is a seal which presents a tortuous path for the flow of fluid therethrough. That is, the fluid must undergo at least two, desirably at least three changes in direction in order to pass through the labyrinth seal. One part of the labyrinth seal may form a gas flow restriction 230 as in the above described embodiments. The gas flow restriction may be formed by substantially vertical and/or horizontal surfaces. The gas flow restriction may also be formed by surfaces substantially perpendicular or parallel to direction of movement between the projection system and the liquid confinement structure surface.

As illustrated in FIG. 10, in one embodiment, the labyrinth seal comprises one downwardly extending projection 221 from the projection system PS and two upwardly extending projections 222, 223 from the liquid confinement structure 12. The projections 221, 222, 223 are arranged to form the labyrinth seal (e.g., a seal which presents a tortuous path for the flow of fluid therethrough). In this embodiment (as is also possible with all other embodiments) a volume with minimal gas flow or a volume of substantially stationary gas is created adjacent the meniscus 210. In the volume with minimal gas flow a lower gas velocity is present. This means that the gas velocity near the meniscus 210 is lower than further away from the meniscus 210. This implies that the equilibrium that will be formed next to the meniscus is not affected or less affected, thus reducing the amount of evaporation energy that needs to be deducted/subtracted from the surroundings. This has an advantage in that there are less evaporational forces close to the meniscus 210 than further from the meniscus 210. The volume with minimal gas flow is also desirable as it reduces the refreshment of the gas volume radially inward of the labyrinth seal, passively resulting in a higher relative humidity of the gas volume. Without the volume with minimal gas flow the gas volume might be refreshed by the gas from a gas knife.

The embodiments of FIGS. 6, 9 and 10 have an advantage over the embodiments of FIGS. 7 and 8 in that the width of the gas flow restriction 230 is not dependent on Z position of the liquid confinement structure 12 relative to the projection system PS in the embodiments of FIGS. 6, 9 and 10. In the embodiments of FIGS. 6, 9 and 10 only the length of the gas flow restriction is dependent on Z position. The position in the X-Y plane of the liquid confinement system 12 is substantially fixed relative to the projection system but some relative movement in the Z direction may be allowable.

Figure 11:
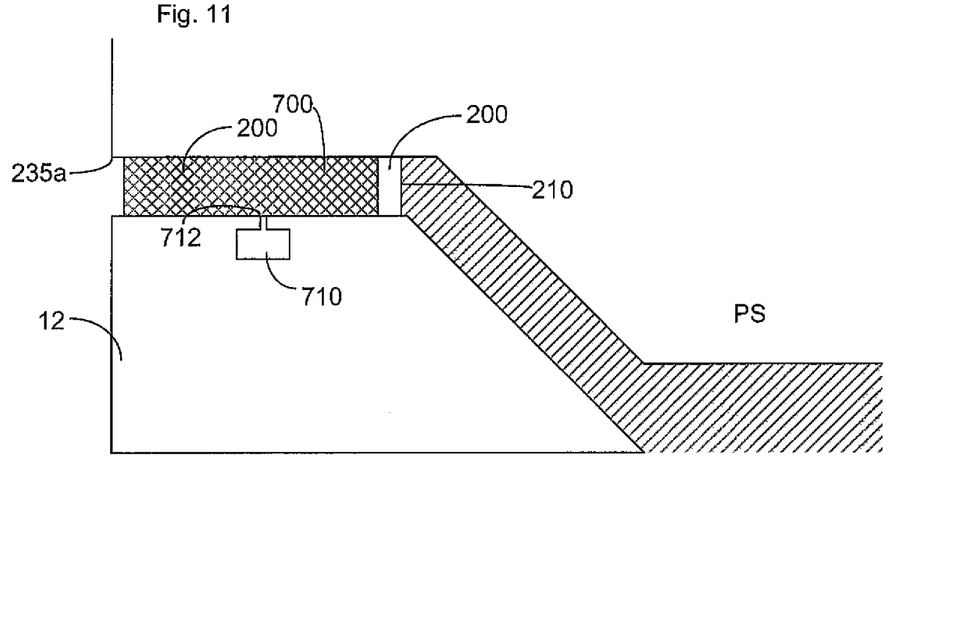
FIG. 11 depicts, in cross-section, a liquid confinement structure and projection system in accordance with a further embodiment of the invention.

FIG. 11 illustrates a further embodiment of the present invention. FIG. 11 is a schematic cross-sectional view through a projection system PS and liquid confinement structure 12. The liquid confinement structure 12 may be any type of liquid confinement structure, for example such as that illustrated in FIG. 6. The embodiment of FIG. 11 is the same as the embodiment of FIG. 6 except as described below.

In the FIG. 11 embodiment, the gas space 200 is at least partly filled by a foam 700. The foam 700 extends vertically between the liquid confinement structure 12 and the projection system PS. The foam 700 is desirably a non solid foam. Thereby substantially no forces are transferred between the projection system PS and the liquid confinement structure 12 through the foam 700. Radially inward of the foam 700, there may be a humid gas space 200 before the meniscus 210 of liquid or the meniscus 210 may touch the foam 700.

In an embodiment, the foam 700 is mainly gas along with bubbles of a liquid. Desirably the liquid is a soap or an oil. Desirably the liquid is or the liquid contains a soap, a surfactant or any other surface-active substance that has a tendency to create bubbles. A suitable liquid has no or a very limited miscibility with the immersion liquid (which may be ultra pure water, a higher NA liquid, etc.) to prevent that the foam is taken away by the immersion liquid. Moreover, the low miscibility has the effect that the purity of the immersion liquid is not affected negatively. Examples include a high molecular weight and/or apolar organic fluid.

The foam 700 may be provided by a foam delivery device 710. An opening 712 in the liquid confinement structure 12 connects the foam supply device 710 with the gas space 200 so that foam 700 can be provided into the gas space 200.

As illustrated, the foam 700 is present up to the meniscus 210 of liquid in the immersion space 11 which meniscus extends between the liquid confinement structure 12 and the projection system PS. The foam 700 has the effect of preventing evaporation of immersion liquid from, e.g., the projection system PS like the embodiment of FIG. 6. The foam prevents/ substantially reduces evaporation in contrast to when no foam is present. A gas space radially inward of the foam is passively humidified resulting in a humid gas space and reduced evaporation. Bubbles of the foam may comprise humid gas, providing a humid gas space. The foam 700, as illustrated, extends substantially up to an edge 235a of the projection system PS. The edge 235a may either be the edge of the projection system PS as a whole or the edge of the final optical element of the projection system PS.

The presence of foam is beneficial since it can effectively reduce the free interaction of the immersion liquid with the gas at the other side of the foam layer. This reduces or even eliminates the immersion liquid evaporation and its associated cooling effect. Indeed the fluid in the foam 700 desirably evaporates only slowly or not at all. The immersion liquid does not pass the foam 700 and liquid of the foam 700 itself evaporates less than the immersion liquid. Thereby a lower thermal load is applied to the projection system. The foam may allow passage of gas.

Therefore, as can be seen, the foam 700 can be seen as an insulator between the projection system PS and the liquid confinement structure 12 in the same way as the humid gas of the embodiments in FIGS. 6-10. Alternatively or additionally the foam may be seen as a contactless seal. That is, the foam hinders or prevents gas and/or liquid from passing it in a radially outward direction and thereby functions as a seal. The seal is contactless in the sense that it transfers substantially no force between the projection system PS and the liquid confinement system 12.

Figure 12:
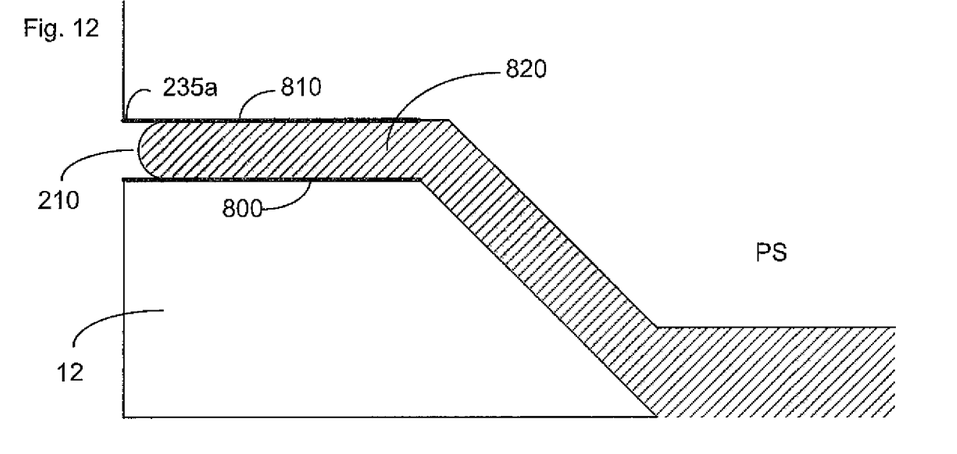
FIG. 12 depicts, in cross-section, a liquid confinement structure and projection system in accordance with a further embodiment of the invention.

FIG. 12 shows a further embodiment. The embodiment of FIG. 12 is the same as the embodiment of FIG. 11 except as described below.

In the embodiment of FIG. 12 the meniscus 210 of immersion liquid is forced in a radially outward direction (all radial directions mentioned herein refer as an origin to the optical axis of the projection system PS). Thereby, the meniscus 210 is positioned substantially at a radially outer edge 235a of the projection system PS or at least a radially outer edge 235a of the final optical element of the projection system PS. In this way no evaporation of immersion liquid from the downwardly facing surface of the final optical element of the projection system PS is possible. By maintaining immersion liquid in contact with that downwardly facing surface of the final optical element of the projection system evaporation from that downwardly facing surface of immersion liquid is effectively prevented. Therefore, it can be seen that the immersion liquid itself is insulating the projection system PS from the liquid confinement structure 12, particularly because of the relatively high heat capacity of the immersion liquid and its low coefficient of heat conduction.

In order to force the immersion liquid in a radially outward direction use of capillary force and/or use of one or more liquidphilic surfaces may be made. For example, the projection system PS and liquid confinement structure 12 may be located close together and may have a bottom surface and a top surface respectively shaped to cooperate such that a capillary gap 820 between the two components is formed. This has the effect of driving the liquid radially outwardly under capillary action. Alternatively or additionally the upwardly facing surface 800 of the liquid confinement structure 12 and/or the downwardly facing surface 810 of the projection system PS may be made of a material or have a coating with which the immersion liquid has a receding contact angle of less than 90°, desirably less than 80, 70, 60, 50, 40, 30, 20 or 10° (i.e. is liquidphilic). Such a measure also has the effect of forcing immersion liquid in a radially outward direction compared to where it would be if those surfaces did not have that property with regard to the immersion liquid.

As is illustrated in FIG. 12, only the horizontal surfaces of the liquid confinement structure 12 and the projection system PS are liquidphilic to the immersion liquid. However, other arrangements are possible. For example, only part of the horizontal surface may be liquidphilic to the immersion liquid. Alternatively or additionally non horizontal downwardly facing surfaces of the projection system PS and/or non horizontal upwardly facing surfaces of the liquid confinement structure 12 radially inwardly of the horizontal surfaces illustrated could also be made to be liquidphilic to the immersion liquid. Desirably at least the part of the surface up to the edge 235a of the projection system PS or final optical element of the projection system PS is made to be liquidphilic to the immersion liquid.

Desirably the lithographic apparatus comprises a barrier member which has a surface which surrounds the immersion space and at least partly defines a boundary of the immersion space. Desirably the barrier member is substantially stationary relative to the projection system. Desirably the liquid confinement structure confines liquid to a localized area of the top surface of the substrate.

The embodiments of FIGS. 6 to 11 may also be used in a mode similar to that of FIG. 12. That is, the meniscus 210 of the immersion liquid from the immersion space 11 may extend radially outward to the vicinity of or up to the flow restriction 230. The meniscus 210 may be pinned at the flow restriction 230. The flow restriction 230 may be radially outward or radially inward or coincide with an edge of a surface of the projection system (such as a final element of the projection system), which may be adversely affected by unregulated temperature fluctuations as a consequence of interaction with evaporating immersion liquid. In an embodiment, the immersion liquid is in contact with an entire surface of the projection system PS, for example the final element, such as the lower surface of the final element. The immersion liquid may help maintain the temperature of the surface of the projection system which interacts and/or contacts immersion liquid. Desirably the surface temperature of the projection system in the immersion system may thereby be regulated. Fluctuations in the surface temperature of the projection system which may contact the immersion system may be reduced, if not prevented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

In an embodiment, a lithographic apparatus may comprise a projection system and a liquid confinement structure configured to at least partly confine immersion liquid to an immersion space defined by the projection system, the liquid confinement structure and a substrate and/or substrate table. A humid gas space may be defined between the projection system, the liquid confinement structure and immersion liquid in the immersion space and the humid gas space being configured to contain humid gas. The lithographic apparatus may further comprise a gas flow restriction located radially outward from the humid gas space.

The gas restriction may be in fluid communication with an external atmosphere and the humid gas space. The gas flow restriction may be a contactless seal between the liquid confinement structure and the projection system and may be configured substantially to hinder a gas flow through the gas restriction. The contactless seal may prevent gas flow through the gas restriction. The gas flow restriction may be configured to hinder or prevent a gas flow radially outwardly, with respect to the optical axis of the apparatus, through the gas restriction.

The gas flow restriction may partition the space between the projection system and the liquid confinement structure into a radially inward space for humid gas and a radially outward part in fluid communication with the external atmosphere. The gas flow restriction may be formed between a substantially horizontal surface of the projection system and a substantially horizontal surface of the liquid confinement structure. The gas flow restriction may be formed between a substantially vertical surface of the projection system and a substantially vertical surface of the liquid confinement structure.

A projection may be formed on the projection system to define the substantially vertical surface of the projection system. The projection may be formed on the liquid confinement structure to define the substantially vertical surface of the liquid confinement structure.

The gas flow restriction may be a gap between the projection system and the liquid confinement structure of less than 3 mm, less than 2 mm, less than 1 mm or 0.5 mm or 0.3 mm or 0.2 mm or 0.1 mm. The gas flow restriction may comprise a labyrinth seal. The labyrinth seal may define a dead volume adjacent a meniscus extending between the liquid confinement structure and the projection system. The dead volume may result in a lower gas velocity near the meniscus than radially outwardly thereof.

In an embodiment a lithographic apparatus may comprise a humid gas source configured to provide humid gas to the humid gas space.

The liquid confinement structure may allow, in use, liquid to flow onto a top surface of a substrate radially outwardly of the immersion space. The liquid confinement structure may comprise features to form a contactless seal with the substrate thereby to confine liquid to the immersion space. The liquid confinement structure and the projection system may not be in contact. In an embodiment, there may be no member positioned between a surface of the liquid confinement structure and a surface of the projection system for defining the gas flow restriction.

The humid gas space may be radially outward of a meniscus extending between the projection system and the liquid confinement structure.

In an embodiment, a lithographic apparatus may further comprise a contactless seal to confine the humid gas. The contactless seal may comprise of foam. The humid gas space may be at least partly filled with a foam. The foam may extend between the liquid confinement structure and the projection system and may be a foam of a liquid. The foam may be or may contain a soap or an oil or a surfactant or any other surface-active substance that has a tendency to create bubbles.

In an embodiment the humid gas space may extend substantially to a radially outward edge of a final optical element of the projection system.

In an embodiment there is a method of reducing an evaporational load from a droplet on a final element of a projection system in an immersion lithography apparatus. A liquid confinement structure may be configured to at least partly confine immersion liquid to an immersion space defined by a projection system, the liquid confinement structure and a substrate and/or substrate table. The method may comprise containing humidified gas in a humid gas space defined between the projection system, the liquid confinement structure and immersion liquid in the immersion space. The method may further comprise restricting the flow of humid gas out of the humid gas space using a gas flow restriction which is in fluid communication with an external atmosphere and the humid gas space.

Restricting the flow of humid gas may be accomplished using a contactless seal between the liquid confinement structure and the projection system such that gas flow through the gas flow restriction is substantially hindered. Gas flow through the gas flow restriction may be prevented using the contactless seal.

The method may further comprise preventing gas flow radially outwardly, with respect to the optical axis of the apparatus, through the gas flow restriction. The gas flow restriction may partition the space between the projection system and the liquid confinement structure into a radially inward space for humid gas and a radially outward part in fluid communication with the external atmosphere.

The gas flow restriction may be formed between a substantially horizontal surface of the projection system and a substantially horizontal surface of the liquid confinement structure.

The gas flow restriction may be formed between a substantially vertical surface of the projection system and a substantially vertical surface of the liquid confinement structure. A projection may be formed on the projection system to define the substantially vertical surface of the projection system. A projection may be formed on the liquid confinement structure to define the substantially vertical surface of the liquid confinement structure.

The gas flow restriction may be a gap between the projection system and the liquid confinement structure of less than 3 mm, less than 2 mm, less than 1 mm or 0.5 mm or 0.3 mm or 0.2 mm or 0.1 mm. The gas flow restriction may comprise a labyrinth seal. The labyrinth seal may define a dead volume adjacent meniscus extending between the liquid confinement structure and the projection system. The dead volume may result in a lower gas velocity near the meniscus than radially outwardly thereof.

The method may further comprise providing humid gas to the humid gas space from a humid gas source. The liquid confinement structure may allow, in use, liquid to flow onto a top surface of a substrate radially outwardly of the immersion space.

The liquid confinement structure may comprise features to form a contactless seal with the substrate to confine liquid to the immersion space. The liquid confinement structure and the projection system may not be in contact.

The humid gas space may be radially outwardly of a meniscus extending between the projection system and the liquid confinement structure. Containing of humid gas may be achieved by using a contactless seal. The contactless seal may comprise of foam.

The method may further comprise partly filling the humid gas space with a foam. The foam may extend between the liquid confinement structure and the projection system. The foam may be a foam of a liquid. The foam may be or may contain a soap or an oil or a surfactant or any other surface-active substance that has a tendency to create bubbles.

In an embodiment a lithographic apparatus may comprise a projection system and a liquid confinement structure to at least partly confine immersion liquid to an immersion space defined by the projection system, the liquid confinement structure and a substrate and/or substrate table. The lithographic apparatus may further comprise a structure to force immersion liquid in a radially outward direction and in contact with a downwardly facing surface of the final optical element of the projection system. The structure may comprise a surface with which the immersion liquid has a receding contact angle of less than 90°, desirably less than 80, 70, 60, 50, 40, 30, 20 or 10°. The surface may be a surface of the projection system and/or a surface of the liquid confinement structure. The surface may include at least a surface of a final optical element of the projection system.

The structure may be arranged to force the immersion liquid by capillary action, desirably wherein capillary action occurs between an upwardly facing surface of the liquid confinement structure and the downwardly facing surface of the final optical element of the projection system.

In an embodiment there is a method of reducing an evaporational load on a projection system in an immersion lithographic apparatus in which a liquid confinement structure at least partly confines immersion liquid to an immersion space defined by the projection system, the liquid confinement structure and a substrate and/or substrate table. The method may comprise forcing immersion liquid in a radially outward direction and in contact with a downwardly facing surface of the final optical element of the projection system.

In an embodiment a lithographic apparatus comprises an optical element insulator located between a projection system and a liquid confinement structure. The insulator may comprise immersion liquid. The insulator may comprise a foam. The insulator may comprise humid gas. The insulator may extend substantially to a radially outward edge of the final element of the projection system.

What is claimed is:

1. A lithographic apparatus comprising:
   a projection system;
   a liquid confinement structure configured to at least partly confine immersion liquid to an immersion space defined by the projection system, the liquid confinement structure and a substrate and/or a substrate table;
   a humid gas space defined between the projection system, the liquid confinement structure and the immersion liquid in the immersion space, the humid gas space configured to contain humid gas to within the humid gas space; and
   an opening, to the humid gas space and connected or connectable to a source of the humid gas, configured to supply the humid gas to the humid gas space.

2. The lithographic apparatus of claim 1, further comprising a gas flow restriction located radially outward from the humid gas space into which the humid gas can flow, the gas flow restriction being in fluid communication with an external atmosphere and the humid gas space.

3. The lithographic apparatus of claim 2, wherein the gas flow restriction is a contactless seal between the liquid confinement structure and the projection system and the contactless seal is configured substantially to hinder a gas flow through the gas flow restriction.

4. The lithographic apparatus of claim 3, wherein the contactless seal is to prevent the gas flow through the gas flow restriction.

5. The lithographic apparatus of claim 2, wherein the gas flow restriction is configured to hinder or prevent a gas flow radially outwardly, with respect to the optical axis of the apparatus, through the gas flow restriction.

6. The lithographic apparatus of claim 2, wherein the gas flow restriction partitions the space between the projection system and the liquid confinement structure into a radially inward space for the humid gas and a radially outward part in fluid communication with the external atmosphere.

7. The lithographic apparatus of claim 2, wherein the gas flow restriction is a gap between the projection system and the liquid confinement structure of less than 3 mm.

8. The lithographic apparatus of claim 2, wherein the gas flow restriction comprises a labyrinth seal.

9. The lithographic apparatus of claim 8, wherein the labyrinth seal defines a dead volume adjacent a meniscus extending between the liquid confinement structure and the projection system which dead volume results in a lower gas velocity near the meniscus than radially outwardly thereof.

10. The lithographic apparatus of claim 1, wherein the liquid confinement structure comprises features to form a contactless seal with the substrate thereby to confine the liquid to the immersion space.

11. The lithographic apparatus of claim 1, wherein the humid gas space is radially outward of a meniscus extending between the projection system and the liquid confinement structure.

12. The lithographic apparatus of claim 1, further comprising a contactless seal to confine the humid gas, wherein the seal contacts one of the projection system or the liquid confinement structure and does not contact the other of the projection system or the liquid confinement structure.

13. The lithographic apparatus of claim 1, further comprising a foam between the projection system and the liquid confinement structure.

14. A method of reducing an evaporational load from a droplet on a final element of a projection system in an immersion lithography apparatus in which a liquid confinement structure is configured to at least partly confine immersion liquid to an immersion space defined by the projection system, the liquid confinement structure and a substrate and/or a substrate table, the method comprising:
   supplying humidified gas, from a source of the humidified gas, via an opening in the immersion lithography apparatus to a humid gas space defined between the projection system, the liquid confinement structure and the immersion liquid in the immersion space; and
   containing the humidified gas in the humid gas space.

15. The method of claim 14, wherein the containing the humidified gas comprises using a gas flow restriction located radially outward from the humid gas space and into which the humid gas can flow, the gas flow restriction being in fluid communication with an external atmosphere and the humid gas space.

16. The method of claim 15, wherein the gas flow restriction is a gap between the projection system and the liquid confinement structure of less than or equal to 3 mm.

* * * * *